United States Patent
Chang et al.

(10) Patent No.: US 8,097,851 B2
(45) Date of Patent: Jan. 17, 2012

(54) LIGHT DETECTION CIRCUIT FOR AMBIENT LIGHT AND PROXIMITY SENSOR

(75) Inventors: Tom Chang, Los Alto, CA (US);
Andrew Grzegorek, San Jose, CA (US);
Chongmei Zhang, Cupertino, CA (US)

(73) Assignee: Eminent Electronic Technology Corp., Hsinchu (TW)

( * ) Notice: Subject to any disclaimer, the term of this patent is extended or adjusted under 35 U.S.C. 154(b) by 0 days.

(21) Appl. No.: 13/117,978

(22) Filed: May 27, 2011

(65) Prior Publication Data

US 2011/0266446 A1    Nov. 3, 2011

Related U.S. Application Data

(63) Continuation of application No. 12/589,360, filed on Oct. 22, 2009, now Pat. No. 7,960,699.

(60) Provisional application No. 61/107,594, filed on Oct. 22, 2008.

(51) Int. Cl.
 *G01J 5/20* (2006.01)

(52) U.S. Cl. ................................... 250/338.4

(58) Field of Classification Search .......... 250/330–335, 250/336.1–336.2, 337, 338.1–338.5, 339.01–339.15, 250/340, 341.1–341.8
See application file for complete search history.

(56) References Cited

U.S. PATENT DOCUMENTS

| | | |
|---|---|---|
| 4,851,681 A | 7/1989 | DePauli |
| 7,148,078 B2 | 12/2006 | Moyer et al. |
| 7,235,773 B1 | 6/2007 | Newman |
| 7,265,397 B1 | 9/2007 | Tower et al. |
| 7,960,699 B2 | 6/2011 | Chang et al. |
| 2002/0109215 A1 | 8/2002 | Iwaya et al. |
| 2003/0183786 A1* | 10/2003 | Seidel et al. .............. 250/504 R |
| 2004/0149036 A1 | 8/2004 | Foxlin et al. |
| 2005/0087675 A1 | 4/2005 | Ayres |
| 2005/0162646 A1 | 7/2005 | Tedesco et al. |
| 2005/0285038 A1* | 12/2005 | Frangioni .................. 250/330 |
| 2006/0044267 A1 | 3/2006 | Xie et al. |
| 2006/0128087 A1 | 6/2006 | Bamji et al. |
| 2006/0164533 A1 | 7/2006 | Hsieh et al. |
| 2007/0085157 A1 | 4/2007 | Fadell et al. |
| 2007/0102738 A1 | 5/2007 | Adkisson et al. |
| 2008/0006762 A1 | 1/2008 | Fadell et al. |
| 2008/0136336 A1 | 6/2008 | Kalnitsky et al. |
| 2008/0167834 A1 | 7/2008 | Herz et al. |
| 2008/0304790 A1 | 12/2008 | Minamio et al. |

OTHER PUBLICATIONS

International Search Report and Written Opinion for PCT/US2010/021499 dated Mar. 2, 2010.
International Search Report and Written Opinion for PCT/US09/05752 dated Dec. 23, 2009.

* cited by examiner

*Primary Examiner* — David Porta
*Assistant Examiner* — Kiho Kim
(74) *Attorney, Agent, or Firm* — McDonnell Boehnen Hulbert & Berghoff LLP

(57) ABSTRACT

A circuit for implementing an ambient light sensing mode and a proximity sensing mode includes a light sensor, a light source, and a controller coupled to the light sensor and the light source. The controller is configured to process outputs from the light sensor before and after the light source is energized to obtain an ambient light level output and to compare the ambient light level output with an output from the light sensor when the light source is energized to implement the proximity sensing mode.

15 Claims, 5 Drawing Sheets

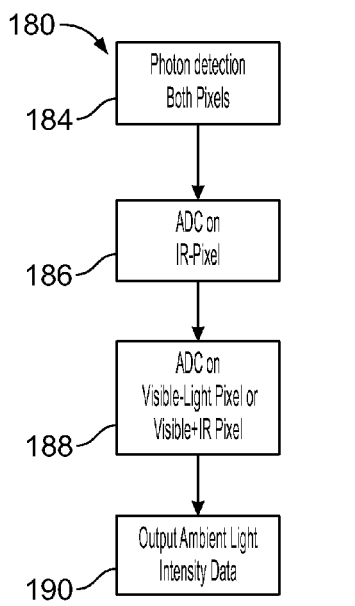
FIG. 8A
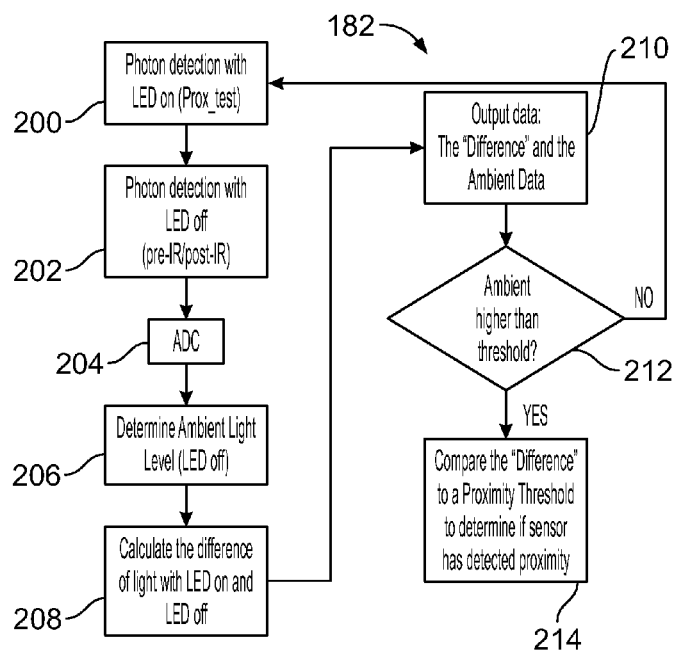
FIG. 8B
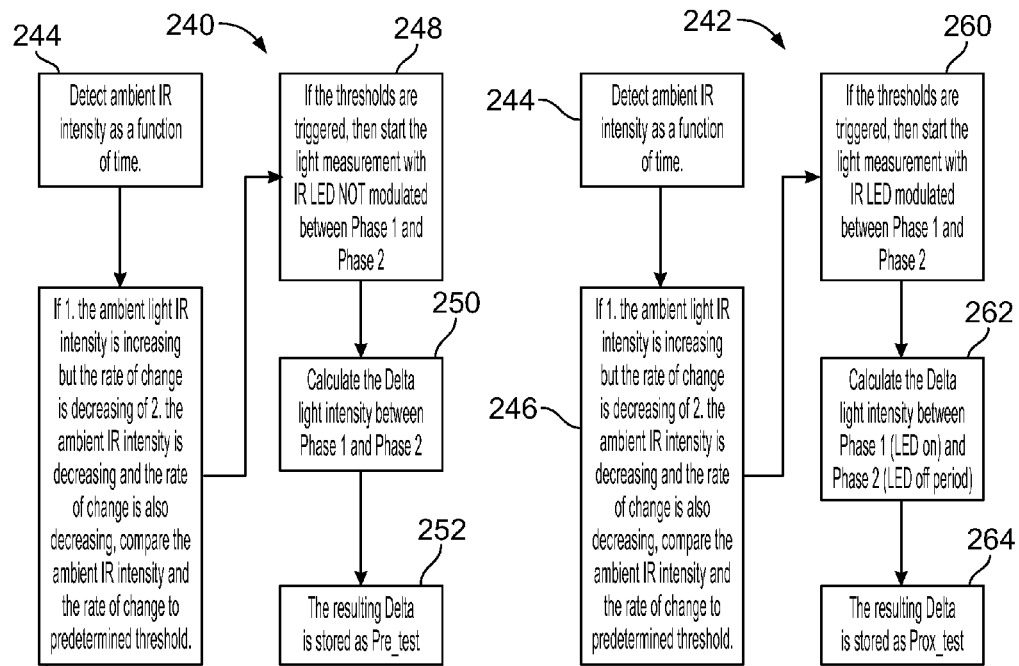
FIG. 9A  FIG. 9B

LIGHT DETECTION CIRCUIT FOR AMBIENT LIGHT AND PROXIMITY SENSOR

CROSS REFERENCE TO RELATED APPLICATIONS

This application is a continuation of U.S. application Ser. No. 12/589,360, filed Oct. 22, 2009, which claims the benefit of U.S. Provisional Patent Application No. 61/107,594 filed Oct. 22, 2008, each of which is incorporated by reference herein in its entirety.

REFERENCE REGARDING FEDERALLY SPONSORED RESEARCH OR DEVELOPMENT

Not applicable

SEQUENTIAL LISTING

Not applicable

BACKGROUND OF THE INVENTION

1. Field of the Disclosure

The present disclosure relates to ambient light and proximity sensors.

2. Background of the Disclosure

Sensors, such as ambient light sensors or proximity sensors, have been developed and incorporated into electronic devices, such as smart phones, personal digital assistants, personal computers or laptops with touch screens, kiosks, and various other types of electronic appliances, games, toys, etc. Such electronic devices commonly include displays that are illuminated to facilitate interaction with a user and ambient light and/or proximity sensors can be used to control the illumination of such displays. In one example, an ambient light sensor is used to adjust the illumination of the display in varying ambient light levels. In another example, a proximity sensor is used to illuminate the display only when a user is detected in a certain proximity to the device in order to conserve power.

SUMMARY OF THE INVENTION

In one example, a circuit for implementing an ambient light sensing mode and a proximity sensing mode includes a light sensor, a light source, and a controller coupled to the light sensor and the light source. The controller is configured to process outputs from the light sensor before and after the light source is energized to obtain an ambient light level output and to compare the ambient light level output with an output from the light sensor when the light source is energized to implement the proximity sensing mode.

BRIEF DESCRIPTION OF THE DRAWINGS

FIG. 8A is a flowchart of a process that can be implemented to provide an ambient light sensing function;

FIG. 8B is a flowchart of a process that can be implemented to provide a proximity sensing function; and FIGS. 9A and 9B are flowcharts of processes that can be implemented to detect and compensate for ambient light noise conditions.

DETAILED DESCRIPTION

In one example, the present disclosure provides a light sensor design that is more sensitive to light in the infrared ("IR") spectrum than to light in the visible spectrum.

In another example, a light sensor that is sensitive to visible and IR light ("Visible+IR sensor") and a light sensor that is more sensitive to IR light ("IR sensor") are used together to result in a light sensor to model a typical human visual system response to visible light intensity. The method to derive the model of the human visual system response can utilize a mathematical function represented by the formula: $Z=aX+bY+c$, where X is an output from the Visible+IR sensor, Y is an output from the IR sensor, Z is a resulting parameter that models the light intensity seen by a typical human visual system, and the parameters a, b, and c are constants that can be derived from empirical testing. In various other embodiments, the parameters a, b, and c can be temperature dependent and/or the equation can generally be in the form of $Z=f(X, Y)$, wherein Z is any combination of mathematical functions of X and Y, e.g., $Z=aX+bY+cX^2+dY^2+eXY+f$.

In yet another example, a single light sensor is designed to model the typical human visual system response to visible light intensity.

Further, the light sensors disclosed herein can be configured as dark current reference sources. The output from such dark current reference sources can be used to offset the effect of dark current in any of the light sensors disclosed herein.

Another aspect of the present disclosure includes a detector chip design that incorporates one or more light sensors. In one embodiment, the detector chip includes a pixel matrix of one or more calibration sensors that surround a light sensor. An output line is coupled to the light sensor, a bias voltage is coupled to the calibration sensor(s), and the light sensor and calibration sensor(s) are further coupled to the same ground to provide more accurate light measurements. Further, the detector chip can include a guard ring that surrounds the pixel matrix to reduce further the sensitivity of the chip to noise. In one example, the guard ring is made of a P+ layer.

The present disclosure also provides a circuit that incorporates one or more of the light sensors disclosed herein to give an accurate light reading with low noise. Various processes or algorithms are also disclosed that can be implemented to allow a single chip to provide both ambient light sensing and proximity sensing functions, to minimize or compensate for ambient light noise conditions, and to minimize power consumption during ambient light sensing and proximity sensing functions.

Figure 1A:
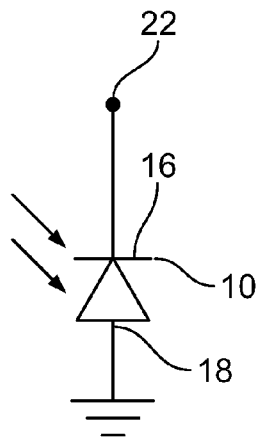
FIGS. 1A and 1B illustrate an electrical schematic and a diagrammatic cross-sectional view, respectively, of a photodiode that is sensitive to both visible and IR light.
Figure 1B:
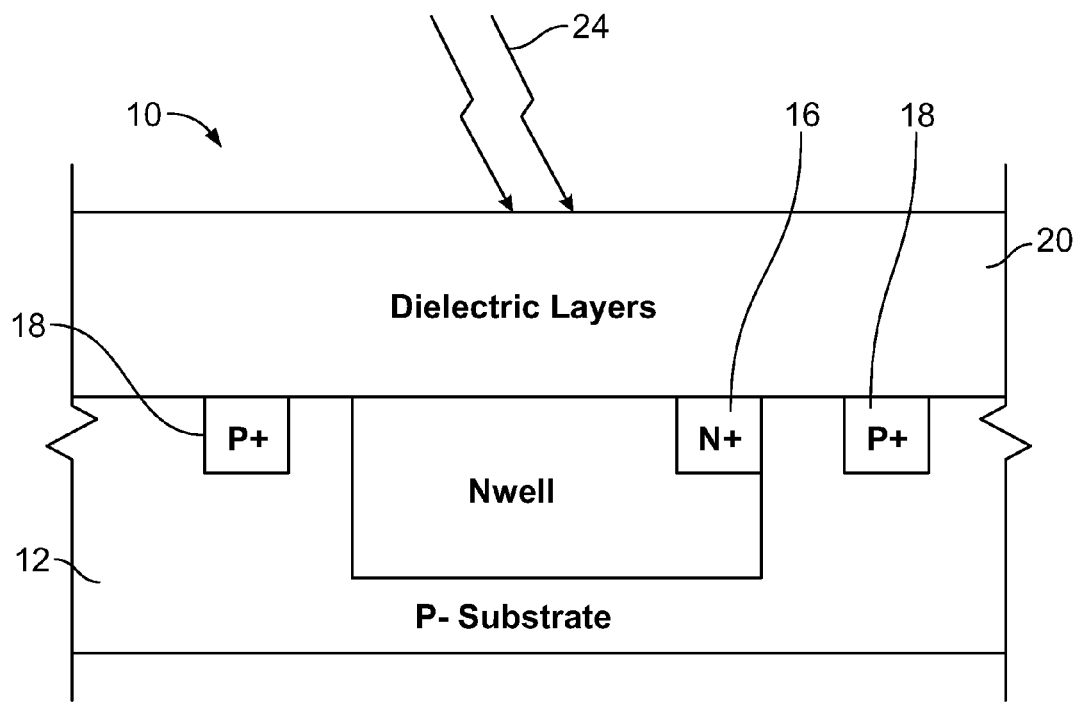

FIGS. 1A and 1B illustrate an example of a light sensor in the form of a reverse biased photodiode 10. In FIG. 1B, the photodiode 10 includes a P-type semiconductor substrate 12 with an N-type well 14 formed over the P-type substrate 12.

The photodiode 10 further includes an N+ doped region 16 disposed within the N-type well 14 and P+ doped regions 18 disposed on opposing sides of the N-type well 14. One or more dielectric layers 20 are disposed over the P-type substrate 12. In the present embodiment, one of the P+ doped regions 18 are connected to ground and the N+ doped region 16 to an output pin 22 to reverse bias the photodiode 10. In use, light 24 impinges on the dielectric layers 20 and generates an output waveform at the output pin 22 that is proportional to the amount of light that impinges on the surface of the photodiode 10. In the embodiment, of FIGS. 1A and 1B, the photodiode 10 is sensitive to light in both visible and IR spectrums.

Figure 2:
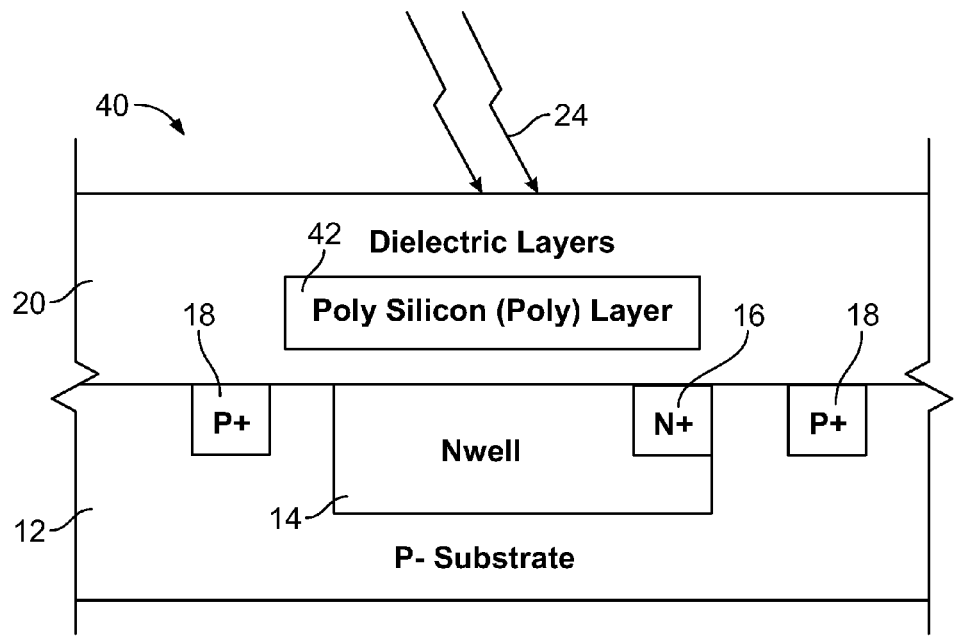
FIG. 2 illustrates a diagrammatic cross-sectional view of a photodiode that has a greater sensitivity to IR light than visible light.

FIG. 2 illustrates a photodiode 40 that is similar to the photodiode 10 of FIG. 1B, but includes an additional poly silicon layer 42 over the P-type substrate 12. The poly silicon layer 42 shifts the spectral response of the photodiode 40 toward the IR spectrum so that the photodiode 40 of FIG. 2 is more sensitive to IR light than to visible light. In one embodiment, the photodiode 40 is used for proximity detection in combination with an IR light source, e.g., an IR light emitting diode ("LED"). In one example, the IR LED is operated to emit IR light and the photodiode 40 senses the reflection of the IR light from surfaces to detect objects in proximity to the photodiode 40.

In one example, a light sensor that is sensitive to visible and IR light ("Visible+IR sensor"), e.g., the photodiode 10 of FIG. 1B, and a light sensor that is more sensitive to IR light ("IR sensor"), e.g., the photodiode 40 of FIG. 2, are used together to provide a light sensor that models a typical human visual system response to visible light intensity. The method to derive the human visual system response can utilize a mathematical function represented by the formula: $Z=aX+bY+c$, where X is an output from the Visible+IR sensor, Y is an output from the IR sensor, and Z is a resulting parameter that models the light intensity seen by a typical human visual system. The parameters a, b, and c are constants that can be derived from empirical testing. In other embodiments, the parameters a, b, and c can be temperature dependent and/or the equation can generally be in the form of $Z=f(X, Y)$, wherein Z is any combination of mathematical functions of X and Y, e.g., $Z=aX+bY+cX^2+dY^2+eXY+f$.

Figure 3A:
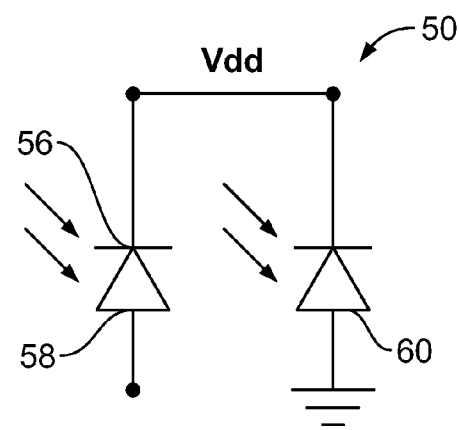
FIGS. 3A and 3B illustrate an electrical schematic and a diagrammatic cross-sectional view, respectively, of a photodiode that has a greater sensitivity to visible light than IR light.
Figure 3B:
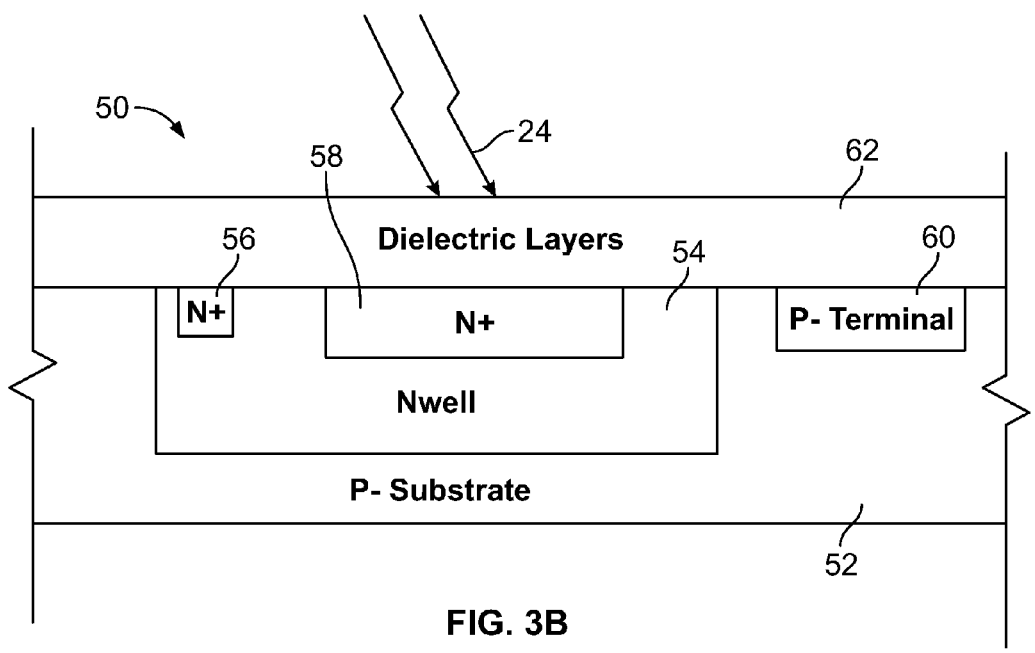

In another example, the use of the mathematical function described above to provide a light sensor that models the typical human visual system response to visible light intensity is made unnecessary through a photodiode 50 illustrated by FIGS. 3A and 3B. The photodiode 50 of FIG. 3B includes a P-type semiconductor substrate 52 with an N-type well 54 formed over the P-type substrate 52. The photodiode 50 further includes an N+ doped region 56 and a P+ doped region 58 disposed within the N-type well 54 and a P-type terminal 60 disposed on a side of the N-type well 54. Further, one or more dielectric layers 62 are disposed over the P-type substrate 52. Referring to FIG. 3A, in one embodiment the N+ doped region 56 is connected to a supply voltage, the P+ doped region 58 is connected to an output pin, and the P-type terminal 60 is connected to ground so that the photodiode 50 is reverse biased. FIG. 3A illustrates two diodes because of the two pn junctions of the photodiode 50.

Figure 4:
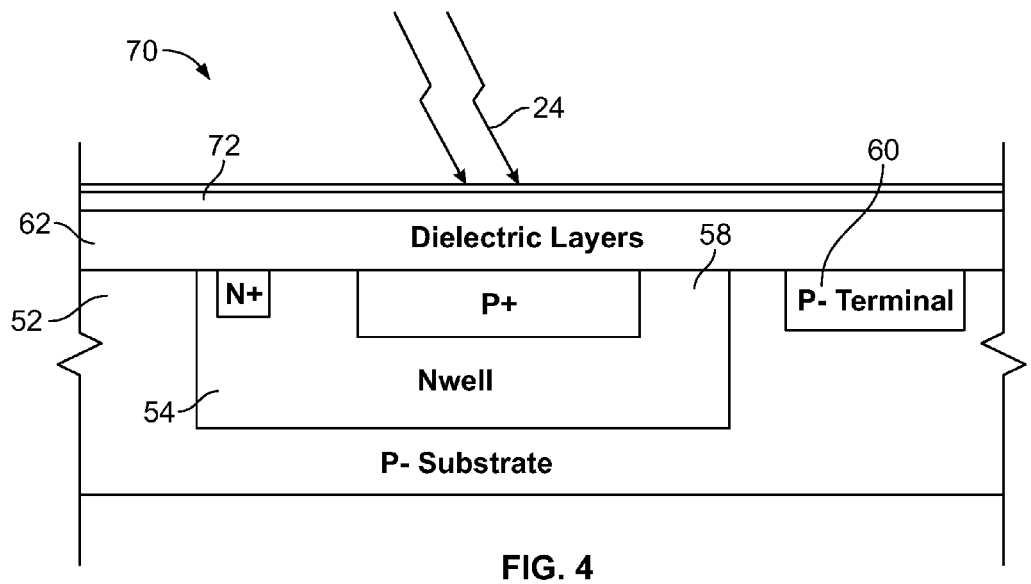
FIG. 4 illustrates a diagrammatic cross-sectional view of a dark reference photodiode.

FIG. 4 illustrates another photodiode 70 that is similar to the photodiode 50 of FIG. 3B with an additional metal layer 72 disposed in the dielectric layer(s) 62. The metal layer 72 functions to prevent light from impinging on the photodiode 70 in order to obtain a dark current reference value. The dark current reference value measures photocurrent generated by background radiation and a saturation current of the semiconductor junction and is also a temperature dependent value. Consequently, the dark current reference value can be subtracted from output generated by a photodiode, e.g., the photodiode 50 of FIG. 3B, to provide a more accurate output that is temperature compensated and takes into account background radiation and other noise conditions. In other embodiments, a metal layer may also be applied to other light sensors, e.g., the photodiodes 10, 40 of FIGS. 1B and/or 2, respectively, to provide a dark current reference value for such light sensors.

Figure 5:
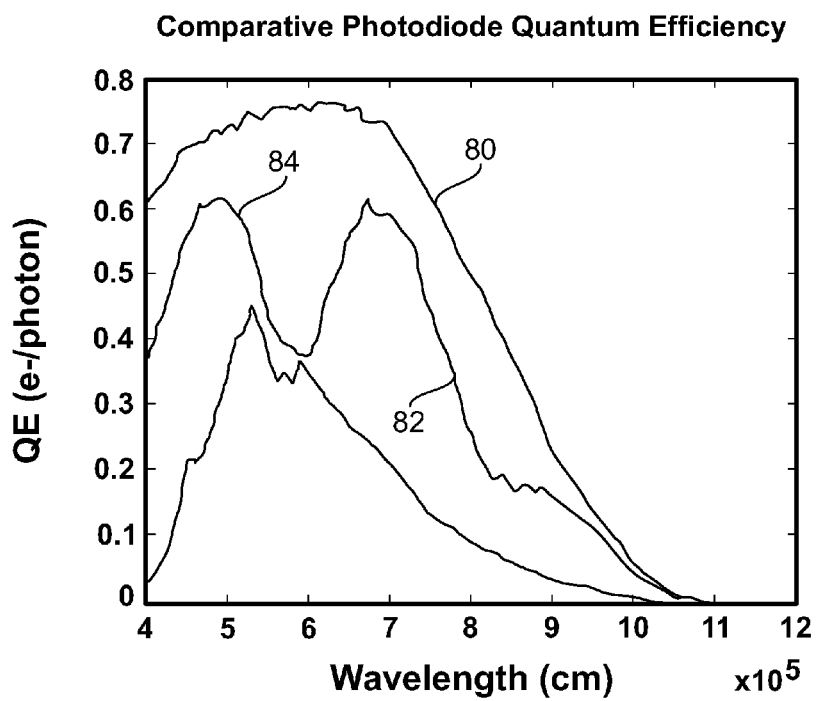
FIG. 5 is a graph that shows spectral responses of various photodiodes.

In FIG. 5, a line 80 illustrates the spectral response of the photodiode 10 of FIG. 1B, a line 82 illustrates the spectral response of the photodiode 40 of FIG. 2, and a line 84 illustrates the spectral response of the photodiode 50 of FIG. 3B. More specifically, FIG. 5 shows that the photodiode 10 is sensitive to light in IR and visible spectrums while the photodiode 40 is tuned to be more sensitive to light in the IR spectrum and the photodiode 50 is tuned to model a typical human visual system response to visible light intensity.

Figure 6:
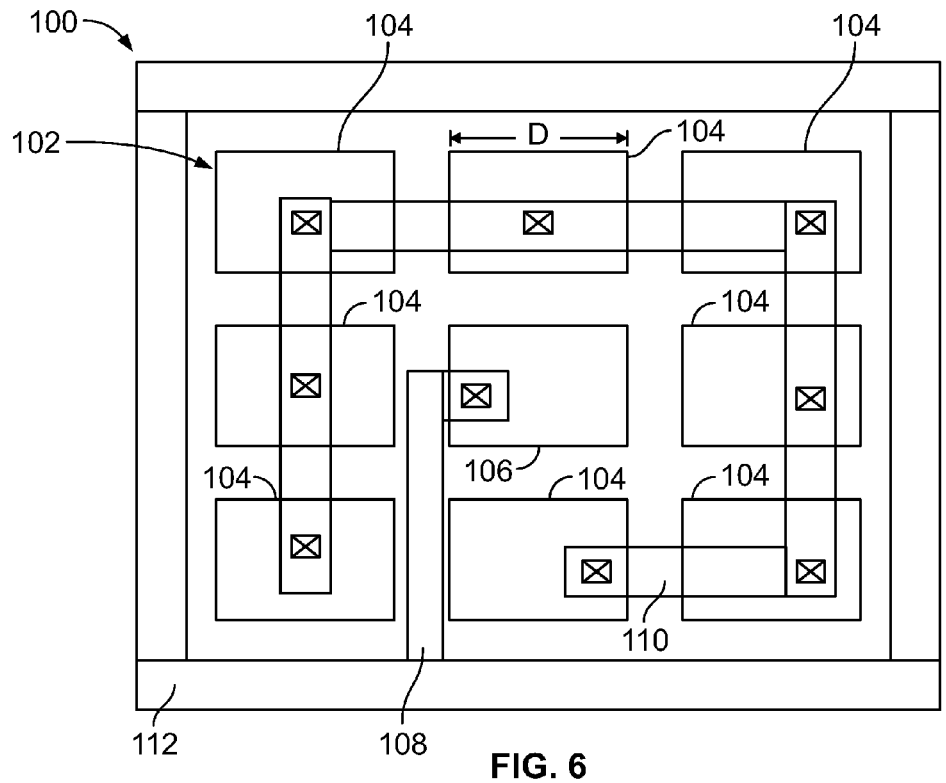
FIG. 6 is a block diagram of a detector design.

FIG. 6 illustrates an embodiment of a detector design 100 that includes one or more light sensors arranged in a pixel matrix 102. In one embodiment, one or more calibration sensors 104 surround a light sensor 106, which can be, for example, any of the photodiodes disclosed herein or any other suitable light sensor. The light sensor 106 is coupled to an output pin 108 while a bias voltage is applied to each of the calibration sensors 104 via a bus 110. In one embodiment, the light sensor 106 and the calibration sensors 104 are further coupled to ground. In another embodiment, the calibration sensors 104 can be biased to a DC voltage level between (and potentially including) a power source voltage level Vdd and a ground voltage level, wherein the DC bias voltage level can be selected and adjusted to enhance the sensitivity and stability of the light sensor 106. In the embodiment of FIG. 6, the calibration sensors 104 are used to offset the parasitic effect of the light sensor 106 that is inherent to the construction or material of the light sensor 106 and not related to incoming light sensitivity. The size of the light sensor 106 and the calibration sensors 104 can vary from about 10 um to about 2 mm. Further, the shape of any of the sensors can vary from square, rectangular, to any other geometry. Generally, the sensitivity of the sensors is affected by the area of the sensor. In another embodiment, a guard ring 112 is placed around the pixel matrix 102 to reduce further the effects of noise. In one embodiment, the guard ring 112 is primarily made of a P+ doped layer.

Figure 7:
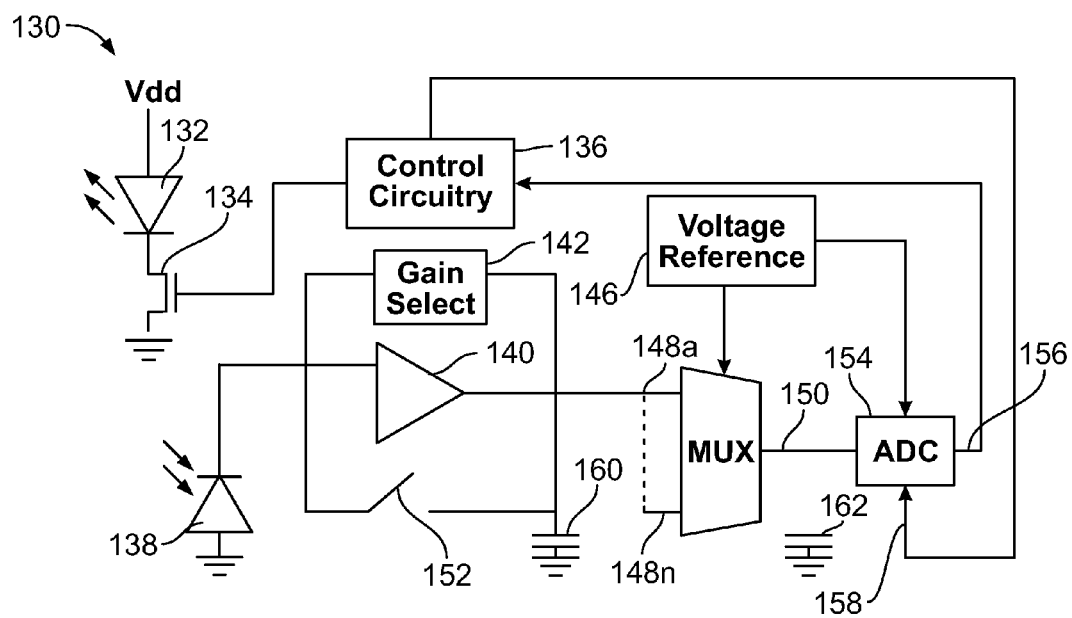
FIG. 7 is a block diagram of a light detection circuit for an ambient light and proximity sensor.

Referring now to FIG. 7, one embodiment of a light detection circuit 130 includes an LED 132 that is coupled to a power source Vdd and to a switch 134. In the present embodiment, the switch 134 is a transistor that is turned on and off by a control signal generated from a microcontroller or other control circuitry 136. The LED 132 can emit visible light, IR light, or light at any other suitable frequency or range of frequencies. In the present embodiment, the LED 132 emits IR light that is reflected from a surface disposed close to an IR sensor 138 for proximity detection. The IR sensor 138, e.g., the photodiode 40 of FIG. 2, is coupled to an amplifier 140, such as a trans-impedance amplifier, that has an adjustable gain 142. An output of the amplifier 140 is coupled to a multiplexer ("MUX") 144 that uses a voltage reference 146 to select a pixel or channel 148a-148n to supply as an output 150. The IR sensor 138 is also coupled to a switch 152 that is closed to reset the waveform supplied to the MUX 144. The switch 152 is opened to collect light intensity data from the IR sensor 138 and closed again after the data is collected. One or more other inputs can be supplied to other pixels 148 of the MUX 144, which can include an output waveform from various other sensors (not shown), e.g., a Visible+IR sensor and/ or a visible light sensor, e.g., the photodiode 50 of FIG. 3B. Such other sensors can be coupled to the pixels 148 of the MUX 144 similarly to the IR sensor 138 shown in FIG. 7, e.g., via an amplifier with an adjustable gain and a reset switch. However, modifications to such connections can be made as would be apparent to one of ordinary skill in the art. The output 150 of the MUX 144 is an analog waveform that is coupled to an analog to digital converter ("ADC") 154, which also receives as an input the voltage reference 146 and converts the analog waveform to digital counts. The voltage reference supplied to the MUX 144 and the ADC 154 can be the same or different. The digital counts are supplied via a line 156 to control circuitry, which can be the same as or different than the control circuitry 136. The control circuitry may include a microcontroller, for example, which interprets the waveforms from the various sensors and controls the operation of an electronic device accordingly. The ADC 154 also includes a reset pin 158. The light detection circuit 130 also includes suitable filters, such as capacitors 160, 162 and/or resistors (not shown), as would be apparent to one of skill in the art.

FIGS. 8A and 8B illustrate a first flowchart 180 for providing an ambient light sensing mode and a second flowchart 182 for providing a proximity sensing mode, respectively. The programming of FIGS. 8A and 8B can be implemented by any suitable circuitry, e.g., the circuit 130 of FIG. 7 with the microcontroller 136, and can utilize any of the light sensors disclosed herein, for example, a single Visible+IR sensor, a combination of a Visible+IR sensor and an IR sensor, or a single visible light sensor, e.g., the photodiode 50 of FIG. 3B. If the combination of a Visible+IR sensor and an IR sensor is used, then the mathematical function described above can be used to obtain ambient light intensity data. In one embodiment, the microcontroller 136 alternatively implements the processes of the first and second flowcharts 180, 182, respectively, to provide both ambient light sensing and proximity sensing in a single device. The ratio of ambient light sensing mode (N) vs. proximity sensing mode (M) can be 1:1 or 1:N or M:1, wherein N and M can be any number from 2 to 20,000. The selection of N and M depends on the application needs, as would be apparent to one of ordinary skill. Further, the use of the ratio can also provide both functions at the lowest power.

Referring more specifically to FIG. 8A, the programming begins at a block 184 that activates light sensors to detect light. In the present embodiment, the light sensors include an IR sensor and a visible light sensor and/or Visible+IR sensor. Following the block 184, control passes to blocks 186, 188 to convert the analog signals from the light sensors to digital signals. Thereafter, control passes to a block 190 to process the digital signals according to the formulas discussed hereinabove, for example, and to output ambient light intensity data.

Referring to FIG. 8B, the programming begins at a block 200 to activate an IR sensor to detect light while an LED is on, wherein the data resulting from the block 200 is referred to as "Prox_test." Next, control passes to a block 202 to activate an IR sensor to detect light while an LED is off. In the present embodiment, the block 202 collects data with the IR sensor before and after the LED is turned on by the block 200 and such data is referred to as "pre-IR" and "post-IR," respectively. Consequently, the block 202 may actually be executed before and after the block 200, although in other embodiments only the pre-IR or the post-IR data may be collected. Following the block 202, control passes to an analog to digital conversion block 204 to convert the analog Prox_test, pre-IR, and post-IR data into digital data. At a block 206, the digital pre-IR and/or post-IR data is processed to determine an ambient light level. The block 206 may process the pre-IR and post-IR data by taking an average, or may interpolate between the pre-IR and post-IR data, or some other appropriate data processing method to determine the ambient light level. After the block 206, control passes to a block 208 that calculates the difference between the Prox_test light level and the ambient light level and a block 210 that outputs the resulting difference calculated by the block 208 and the ambient light level. A decision block 212 thereafter determines if the ambient light level is higher than a pre-set ambient light threshold and, if not, control passes back to the block 200. If the decision block 212 determines that the ambient light level is higher than a pre-set ambient light threshold, then control passes to a block 214 that compares the difference data calculated by the block 208 to a proximity threshold value to determine if the IR sensor has detected an object in proximity thereto.

Various modifications can be made to the processes of FIGS. 8A and 8B without departing from the spirit of the present disclosure, e.g., the order of the processes can be modified and/or fewer or additional processes can be performed. For example, the block 212 may be omitted in some embodiments and control may pass directly from the block 210 to the block 214. Further, the values of the pre-set ambient light threshold and/or the proximity threshold value can be set to any suitable value and may change depending on the specific application, as would be apparent to one of skill in the art.

FIGS. 9A and 9B illustrate flowcharts 240, 242 that can be implemented to detect noise effects in ambient light, e.g., 50/60 Hz noise effects, and to minimize the contribution of such effects on light measurements. More particularly, a controller, such as the controller 136 of FIG. 7, executes blocks 244, 246 to activate a sensor, such as, the photodiode 40 of FIG. 2, to detect light intensity as a function of time, to identify a period during which light modulation due to noise is a minimum, and to compare the light intensity and rate of change during such period to pre-determined threshold values. The programming of FIGS. 9A and 9B, only obtains light measurements during periods when light modulation due to noise is a minimum and when the light intensity and rate of change exceed the threshold values. This greatly reduces the LED current necessary to differentiate reflected IR light from ambient light changes due to noise. Further, noise can be compensated for by taking light measurements without the LED on, e.g., pre-IR and post-IR data, and with the LED on, e.g., Prox_test data, and processing such data as described above.

Referring to FIG. 9A, at a block 248, if the intensity and rate of change exceed the threshold values, then the sensor is activated to obtain light measurements with the LED off during a sample period defined by two sample events, phase 1 and phase 2. Next, control passes to a block 250 to calculate the change in light intensity during the sample period. A block 252 then stores the result of the block 250 as Pre_test, pre-IR, or post-IR, as discussed above.

Referring to FIG. 9B, at a block 260, if the intensity and rate of change exceed the threshold values, then the sensor is activated to obtain light measurements with the LED on during a sample period defined by two sample events, phase 1 and phase 2. Next, control passes to a block 262 to calculate the change in light intensity during the sample period. A block 264 stores the result of the block 250 as Prox_test, as discussed above. In one example, the LED is modulated by repeatedly turning the LED on and off during the sample period with a square wave (or other waveform) at a frequency substantially higher than the frequency of the noise effect, e.g., at around 500 Hz to around 50 kHz. Modulation of the LED further helps to minimize the contribution of noise effects on the light measurements. A controller can process the Prox_test, pre-IR, and post-IR data that result from executing the programming of FIGS. 9A and 9B to obtain a noise compensated proximity reading.

In yet another operating mode, a light sensing chip is put into an "idle" mode during which most of the chip functions are turned off to save power. During the idle mode, only a low power clock is active to keep track of the idle time. The chip is activated periodically to perform the ambient light sensing or proximity sensing functions. The ratio of measurement (active) time vs. idle time can be from about 1:1 to 1:99.

Other embodiments of the disclosure including all the possible different and various combinations of the individual features of each of the foregoing described embodiments are specifically included herein.

INDUSTRIAL APPLICABILITY

The present disclosure provides various sensor designs, circuits incorporating such sensor designs, and processes to control such circuits to determine ambient light levels and to function as proximity sensors.

Numerous modifications to the present disclosure will be apparent to those skilled in the art in view of the foregoing description. Accordingly, this description is to be construed as illustrative only and is presented for the purpose of enabling those skilled in the art to make and use the disclosure and to teach the best mode of carrying out the same. The exclusive right to all modifications within the scope of this disclosure is reserved.

We claim:

1. A circuit for implementing an ambient light sensing mode and a proximity sensing mode, comprising:
    a light sensor;
    a light source; and
    a controller coupled to the light sensor and the light source, wherein the controller is configured to process outputs from the light sensor before and after the light source is energized to obtain an ambient light level output and to compare the ambient light level output with an output from the light sensor when the light source is energized to implement the proximity sensing mode.

2. The circuit of claim 1, wherein the controller is configured to compare the ambient light level output with the output from the light sensor with the light source energized to implement the proximity sensing mode only if the ambient light level output is higher than an ambient light threshold value.

3. The circuit of claim 1, wherein the controller is configured to calculate a difference between the output from the light sensor with the light source energized and the ambient light level output to implement the proximity sensing mode.

4. The circuit of claim 3, wherein the controller is configured to compare the difference to a proximity threshold value to determine if the light sensor has detected an object in proximity thereto.

5. The circuit of claim 1, wherein the light sensor is more sensitive to light in the infrared spectrum than to light in the visible spectrum.

6. The circuit of claim 5, wherein the light sensor includes a P-type substrate with an N-type well formed over the P-type substrate, an N+ doped region disposed within the N-type well, P+ doped regions disposed on opposing sides of the N-type well, and a filter layer disposed over the P-type substrate for shifting the spectral response of the first light sensor toward the infrared spectrum.

7. The circuit of claim 6, wherein the filter layer is a poly silicon layer.

8. The circuit of claim 6, wherein the light sensor further includes a dielectric layer disposed over the P-type substrate and the filter layer is disposed in the dielectric layer.

9. The circuit of claim 8, wherein the filter layer is a poly silicon layer.

10. The circuit of claim 1, wherein the light source emits light in the infrared spectrum.

11. The circuit of claim 1, further comprising one or more calibration sensors disposed adjacent the light sensor, wherein the light sensor is coupled to an output pin and a bias voltage is applied to the one or more calibration sensors to enhance the sensitivity of the light sensor.

12. The circuit of claim 11, further comprising a guard ring disposed round the light sensor and the one or more calibration sensors.

13. The circuit of claim 12, wherein the guard ring primarily comprises a P+ doped layer.

14. The circuit of claim 11, further comprising a plurality of calibration sensors that surround the light sensor.

15. The circuit of claim 11, wherein the one or more calibration sensors provide one or more dark current reference values to the controller.

* * * * *